(12) United States Patent
Tang (10) Patent No.: US 10,488,694 B2
(45) Date of Patent: Nov. 26, 2019

(54) IN-CELL TOUCH PANEL AND DISPLAY DEVICE

(71) Applicant: Wuhan China Star Optoelectronics Technology Co., Ltd., Wuhan, Hubei (CN)

(72) Inventor: Yuejun Tang, Hubei (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 6 days.

(21) Appl. No.: 15/744,780

(22) PCT Filed: Dec. 13, 2017

(86) PCT No.: PCT/CN2017/116000
§ 371 (c)(1),
(2) Date: Jan. 13, 2018

(87) PCT Pub. No.: WO2019/085168
PCT Pub. Date: May 9, 2019

(65) Prior Publication Data
US 2019/0129215 A1    May 2, 2019

(30) Foreign Application Priority Data
Oct. 31, 2017   (CN) .......................... 2017 1 1046930

(51) Int. Cl.
*G02F 1/1333*   (2006.01)
*G02F 1/1335*   (2006.01)
(Continued)

(52) U.S. Cl.
CPC .... *G02F 1/13338* (2013.01); *G02F 1/133512* (2013.01); *G02F 1/133514* (2013.01);
(Continued)

(58) Field of Classification Search
None
See application file for complete search history.

(56) References Cited

U.S. PATENT DOCUMENTS

| 2011/0187669 | A1* | 8/2011 | Abiru | G02F 1/13338 345/173 |
| 2017/0147123 | A1* | 5/2017 | Wang | G06F 3/0412 |
| 2017/0307924 | A1* | 10/2017 | Liu | G06F 3/044 |

FOREIGN PATENT DOCUMENTS

| CN | 102135824 A | 7/2011 |
| CN | 103970312 A | 8/2014 |

(Continued)

*Primary Examiner* — Kenneth B Lee, Jr.
(74) *Attorney, Agent, or Firm* — Hemisphere Law, PLLC; Zhigang Ma (57) ABSTRACT

An in-cell touch panel and display device are provided. The in-cell touch panel includes TFT array substrate and color filter substrate corresponding to TFT array substrate, and in-cell touch panel is divided to display region and non-display region. In non-display region, chip bonding portion and first electrode are positioned on TFT array substrate and is electrically connected with chip bonding portion; second electrode and projection are formed on color filter substrate, second electrode is covered on projection; wherein an end of projection is contacted to first electrode for electrically conducting first electrode and second electrode. In the display region, touch electrode and touch wire are positioned on color filter substrate, first terminal of touch wire is electrically connected with touch electrode, second terminal of touch wire is extended to non-display region and electrically connected with second electrode.

14 Claims, 5 Drawing Sheets

(51) Int. Cl.
*G02F 1/1362* (2006.01)
*G06F 3/041* (2006.01)
*G06F 3/047* (2006.01)
*H01L 27/12* (2006.01)

(52) U.S. Cl.
CPC .. *G02F 1/133602* (2013.01); *G02F 1/136286* (2013.01); *G06F 3/047* (2013.01); *G06F 3/0412* (2013.01); *H01L 27/124* (2013.01); *G02F 2201/121* (2013.01); *G02F 2201/123* (2013.01)

(56) References Cited

FOREIGN PATENT DOCUMENTS

| | | |
|---|---|---|
| CN | 105786263 A | 7/2016 |
| CN | 106371669 A | 2/2017 |
| TW | 201126238 A | 8/2011 |

\* cited by examiner

IN-CELL TOUCH PANEL AND DISPLAY DEVICE

RELATED APPLICATIONS

The present application is a National Phase of International Application Number PCT/CN2017/116000, filed Dec. 13, 2017, and claims the priority of China Application No. 201711046930.0, filed Oct. 31, 2017.

FIELD OF THE DISCLOSURE

The disclosure relates to a display technical field, and more particularly to an in-cell touch panel and display device.

BACKGROUND

With development of information generation and life gradually accelerated, touch panel is replaces traditional mouse and keyboard by humanized design and simple, easily to type, which is widely applied to various electrical products. The capacitive touch screen has numbers of advantageous for response fast, high sensitivity, high reliability and good durability such that be widely used.

Touch display panel divides to In-cell, On-cell according to position of touch sensing layer on the display panel. In-cell touch panel is integrated the touch function in the display panel such that effectively reduces thickness of whole display device and simplified manufacture, more light the products, decreases the cost, which have gained wide popularity.

In current technology of the in-cell touch panel, the touch panel structure usually direct positioned on array substrate. Major, some structure for transporting display signal in the array substrate which is also be a touch electrode, for example data line and scan line, or the common electrode layer also to be used a touch electrode, and then controlling theses structure portion for transporting display signal and control signal by times. The in-cell touch panel has these structures which has high integration of structure portion on the array substrate and difficult manufacture because the touch electrode is used by the structure portion for transporting display signal. Secondly, because high integration of structure portion on the array substrate, which is hard to control the stability of touch signal and the interference to display by the integrity touch structure is more serious.

SUMMARY

A technical problem to be solved by the disclosure is to provide an in-cell touch panel with enhances stable of touch signal of the in-cell touch panel and decreases the difficulty of manufacture.

An objective of the disclosure is achieved by following embodiments. In particular, an in-cell touch panel including a TFT array substrate and a color filter substrate corresponding to the TFT array substrate, and the in-cell touch panel is divided to a display region and a non-display region.

In the non-display region, a chip bonding portion and a first electrode are positioned on the TFT array substrate, and the first electrode is electrically connected with the chip bonding portion; a second electrode and a projection are formed on the color filter substrate, the second electrode is covered on the projection; wherein an end of the projection is contacted to the first electrode for electrically conducting the first electrode and the second electrode.

In the display region, a touch electrode and a touch wire are positioned on the color filter substrate, a first terminal of the touch wire is electrically connected with the touch electrode, a second terminal of the touch wire is extended to the non-display region and electrically connected with the second electrode.

In an embodiment, the touch electrode and the touch wire are positioned on different layers, the touch electrode is electrically connected with the first terminal of the touch wire according to a first hole, and the second electrode is electrically connected with the second terminal of the touch wire according to a second hole.

In an embodiment, the color filter substrate comprises a glass substrate and, a black matrix and a color photoresist layer sequentially are formed on the glass substrate, the projection is formed on the color photoresist layer; position of the touch wire and the touch electrode as structure (I) or structure (II).

Structure (I), the touch wire is positioned between the color photoresist layer and the black matrix, and the touch electrode is positioned on a side of the color photoresist layer which is positioned away from the black matrix.

Structure (II), the touch wire is positioned between the black matrix and the glass substrate, and the touch electrode is positioned on a side of the color photoresist layer which is positioned away from the black matrix.

In an embodiment, a first planar layer is positioned on the color photoresist layer, the projection is formed on the first planar layer; position of the touch wire and the touch electrode is selected from one of structure (I), structure (II), structure (III) and structure (IV).

Structure (III), the touch wire is positioned between the color photoresist layer and the first planar layer, and the touch electrode is positioned on a side of the first planar layer which is positioned away from the color photoresist layer.

Structure (IV), a second planar layer is positioned between the color photoresist layer and the first planar layer, the touch wire is positioned between the second planar layer and the first planar layer, and touch electrode is positioned on a side of the first planar layer which is positioned away from the second planar layer.

In an embodiment, the touch electrode includes a plurality of square electrodes arranged in array, and the touch wire coupled between each of the square electrode and the chip bonding portion is independently.

In an embodiment, the color filter substrate further comprises a common electrode; wherein the touch electrode is to be the common electrode, the touch electrode separately applying a touch signal and a common voltage signal by time.

In an embodiment, the first electrode is electrically connected with the chip bonding portion by a connecting wire positioned on the TFT array substrate, and area of the first electrode is greater than area of end of the projection.

In an embodiment, a pixel electrode layer is positioned on the TFT array substrate, the first electrode and the connecting wire are respectively positioned in the pixel electrode layer.

In an embodiment, a signal-line layer, a insulating layer and the pixel electrode layer are sequentially positioned on the TFT array substrate, the first electrode is positioned in the pixel electrode layer, the connecting wire is positioned in the signal-line layer, and the first electrode is electrically connected with the connecting wire by a hole located on the insulating layer.

According to another aspect of the disclosure, the disclosure further provides a display device. The display device includes a liquid crystal display panel and a backlight system, the liquid crystal display panel is correspondingly positioned to the backlight system, the backlight system provides light source to the liquid crystal display panel for displaying image. The liquid crystal display panel is an in-cell touch panel as described above.

The in-cell touch panel of the embodiment in this invention which is positioned the in-cell touch structure on the color filter substrate, and the connecting wire which positioned in the non-display region is connected to the array substrate. Comparing with the array substrate, the color filter substrate has simple structure so that interference between in-cell touch structure and other structure is probably decreased. It enhances stable of the touch signal of in-cell touch panel, and decreases difficulty of manufacture.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

Here, it is also worthy to note that, in order to prevent the present disclosure from being obscured due to unnecessary details, the drawings only illustrate the structure and/or processing steps closely related to the technical solution of the present disclosure, while other details less related to the present disclosure are omitted.

Figure 1:
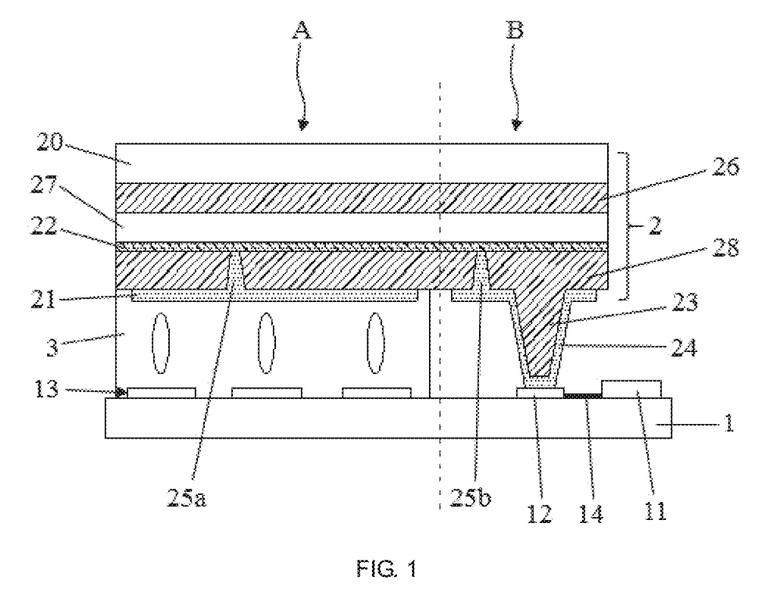
FIG. 1 is a structural schematic view of an in-cell touch panel according to an embodiment of the disclosure.

The in-cell touch panel in this embodiment, please refer to FIG. 1. The in-cell touch panel includes a TFT array substrate 1 and a color filter substrate 2 corresponding to the TFT array substrate 1. The in-cell touch panel further includes a liquid crystal layer positioned between the TFT array substrate 1 and the color filter substrate 2. The in-cell touch panel is divided to a display region A and a non-display region B.

Wherein, in the display region A, the TFT array substrate 1 includes a display pixel arranged in array. A touch electrode 21 and a touch wire 22 are positioned on the color filter substrate 2. A first terminal of the touch wire 22 is electrically connected with the touch electrode 21, and a second terminal of the touch wire 22 is extended to the non-display region B.

Wherein, in the non-display region B, a chip bonding portion 11 and a first electrode 12 are positioned on the TFT array substrate 1. The first electrode 12 is electrically connected with the chip bonding portion 11. A projection 23 and a second electrode 24 are formed on the color filter substrate 2. The second electrode 24 is covered on the projection 23, and a second terminal of the touch wire 22 is electrically connected with the second electrode 24.

Wherein, the projection 23 is formed on the color filter substrate 2 and extended toward to the TFT array substrate 1. An end of the projection 23 is contacted to the first electrode 12 for electrically conducting the first electrode 12 and the second electrode 24.

Wherein, the touch electrode 21 and the touch wire 22 are positioned on different structure layers. The touch electrode 21 is electrically connected with the first terminal of the touch wire 22 by a first hole 25a, the second electrode 24 is electrically connected with the second terminal of the touch wire 22 by a second hole 25b.

As the in-cell touch panel described above, the structure of in-cell touch panel (touch electrode 21 and touch wire 22) is positioned in the color filter substrate 2 and electrically connected with TFT array substrate 1 by the connecting wire positioned on the non-display region B. Specifically, the touch electrode 21 is electrically connected to the chip bonding portion 11 on the TFT array substrate 1 according to the touch wire 22, the second electrode 24 and the first electrode 21 sequentially. After the chip bonding portion 11 contacted with the touch driver chip, a signal is to be established between the touch electrode 21 and the touch driver chip.

In this embodiment, please refer to FIG. 1. The color filter substrate 2 comprises a glass substrate 20 and, a black matrix 26, a color photoresist layer 27 and the first planar layer 28 are sequentially formed on the glass substrate 20. The projection 23 is formed on the first planar layer 28. Wherein the specifically position of the touch wire 22 and the touch electrode 21 on the color filter substrate 2 as the below structure. Structure (III), the touch wire 22 is positioned between the color photoresist layer 27 and the first planar layer 28. The touch electrode 21 is positioned on a side of the first planar layer 28 which is positioned away the color photoresist layer 27. At this time, the first hole 25a and the second hole 25 b are respectively positioned in the first planar layer 28.

Figure 2:
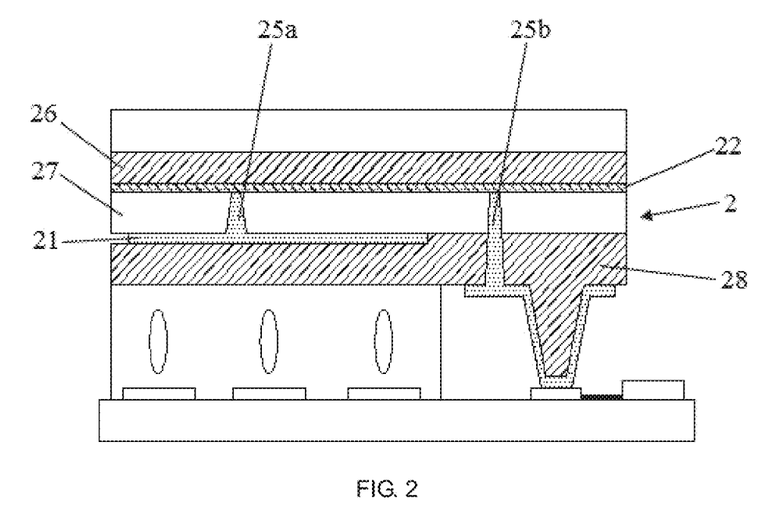
FIG. 2 to FIG. 4 are structural schematic view of distributing an in-cell touch structure on the color filter substrate according to some embodiments of the disclosure.

In another embodiment, please refer to FIG. 2. The specifically position of the touch wire 22 and the touch electrode 21 on the color filter substrate 2 as the below structure. Structure (I), the touch wire 22 is positioned between the color photoresist layer 27 and the black matrix 26. The touch electrode 21 is positioned on a side of the color photoresist layer 27 which is positioned away the black matrix 26. At this time, the first hole 25a is positioned and pass through the color photoresist layer 27, and the second hole 25b is sequentially pass through the first planar layer 28 and the color photoresist layer 27.

Figure 3:
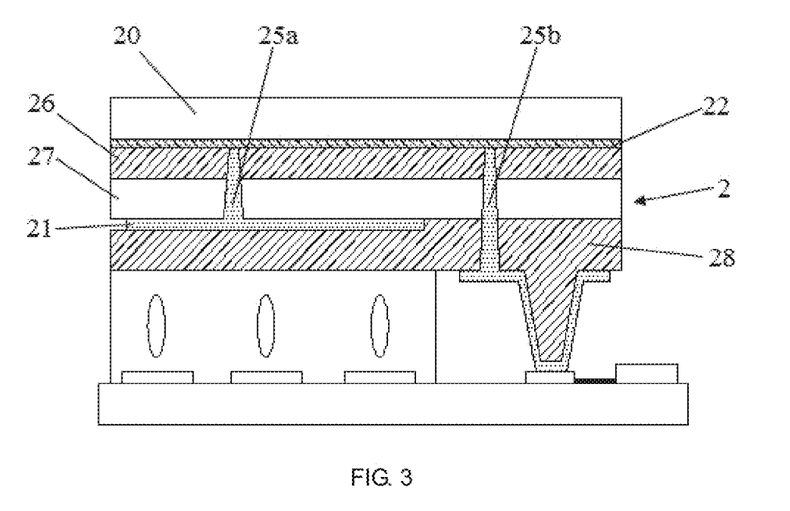

In another embodiment, please refer to FIG. 3. The specifically position of the touch wire 22 and the touch electrode 21 on the color filter substrate 2 as the below structure. Structure (II), the touch wire 22 is positioned between the black matrix 26 and the glass substrate 20. The touch electrode 21 is positioned on a side of the color photoresist layer 27 which is positioned away the black matrix 26. At this time, the first hole 25a is sequentially pass through the color photoresist layer 27 and the black matrix 26, and the second hole 25b is sequentially pass through the first planar layer 28, the color photoresist layer 27 and the black matrix 26.

Figure 4:
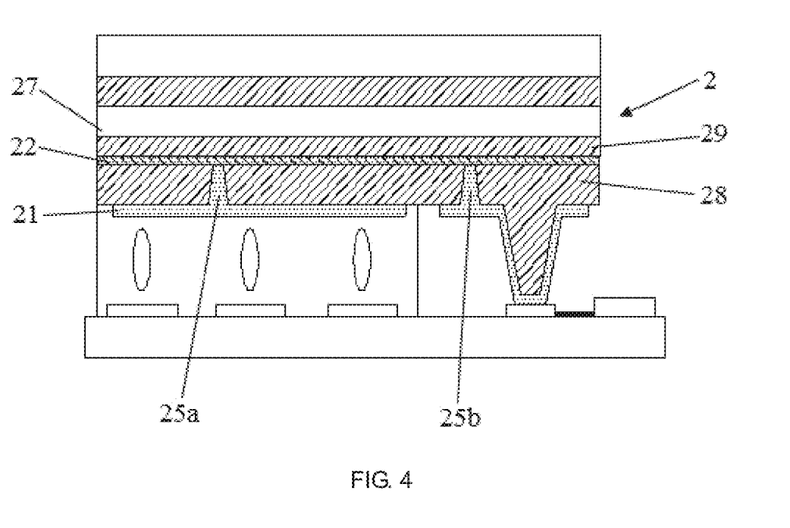

In another embodiment, please refer to FIG. 4. The specifically position of the touch wire 22 and the touch electrode 21 on the color filter substrate 2 as the below structure. Structure (IV), a second planar layer 29 is positioned between the color photoresist layer 27 and the first planar layer 28. The touch wire 22 is positioned between the second planar layer 29 and the first planar layer 28. The touch electrode 21 is positioned on a side of the first planar layer 28 which is positioned away the second planar layer 29. At this time, the first hole 25a and the second hole 25b are respectively positioned in the first planar layer 28.

In addition, in some liquid crystal display panels. The color filter substrate includes glass substrate and, black matrix and color photoresist layer sequentially are formed on the glass substrate, and there without any planar layer positioned on the color photoresist layer. According to these structures of color filter substrates, it could choose the structure (I) or structure (II) for position the touch wire and the touch electrode. In this embodiment, the correspondingly projection is directly formed on the color photoresist layer.

In addition, in some liquid crystal display panels. The color filter substrate further comprises a common electrode for applying common voltage signal. In this embodiment, the touch electrode 21 is selects to be the common electrode. The touch electrode 21 separately applying a touch signal and a common voltage signal by time.

Wherein, a person of skill in art will know. The display pixel of TFT array substrate 1 usually includes thin film transistor, data line, scan line and pixel electrode and so on. In this embodiment provides an example for the pixel electrode layer 13 is positioned on the TFT array substrate shown as FIG. 1. In this embodiment, please refer to FIG. 1. The first electrode 12 is electrically connected with the chip bonding portion 11 by a connecting wire 14 positioned on the TFT array substrate 1. Area of the first electrode 12 is greater than area of end of the projection 23. Further, the first electrode 12 and the connecting wire 14 are respectively positioned in the pixel electrode layer 13.

Figure 5:
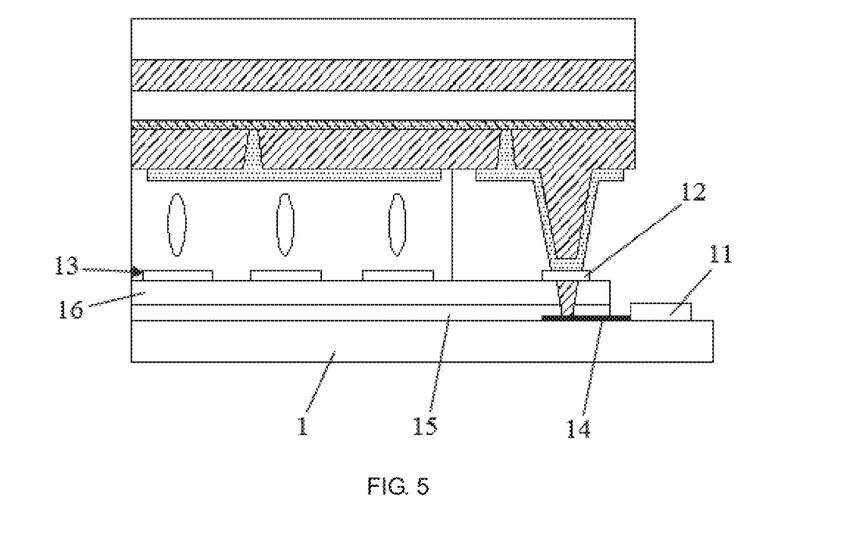
FIG. 5 is a schematic view of connection between the first electrode of the TFT array substrate and the chip bonding portion according to an embodiment of the disclosure.

In another embodiment, the connecting wire 14 also could be positioned in the signal-line layer. Specifically, please refer to FIG. 5. In this embodiment provides an example which is a signal-line layer 15, an insulating layer 16 and the pixel electrode layer 13 are sequentially positioned on the TFT array substrate 1 shown as FIG. 5. The signal-line layer 15 is a data-line layer or scan-line layer. The first electrode 12 is positioned in the pixel electrode layer 13. The connecting wire 14 is positioned in the signal-line layer is positioned in the signal-line layer 15. The first electrode 12 is electrically connected with the connecting wire 14 by a hole which is located in the insulating layer 16. it could provides better performance of electrically connected between the first electrode 12 and the chip bounding portion 11 when positioned the connecting wire 14 in the signal-line layer 15.

Figure 6:
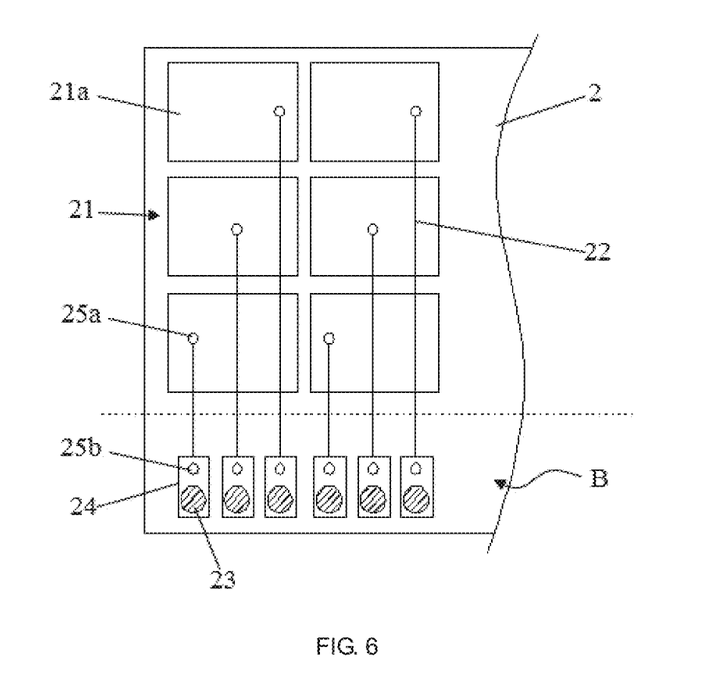
FIG. 6 and FIG. 8 are structural schematic view of a touch electrode, a second electrode and a projection on the color filter substrate according to some embodiments of the disclosure.

In this embodiment, please refer to FIG. 6. The touch electrode 12 includes a plurality of square electrodes 21a arranged in array. Each of the square electrodes 21a is respectively connecting with each of correspondingly touch wires 22 by the first holes 25a. The connecting wire coupled between each of square electrodes 21a and the chip bounding portion 11 is independently.

Figure 7:
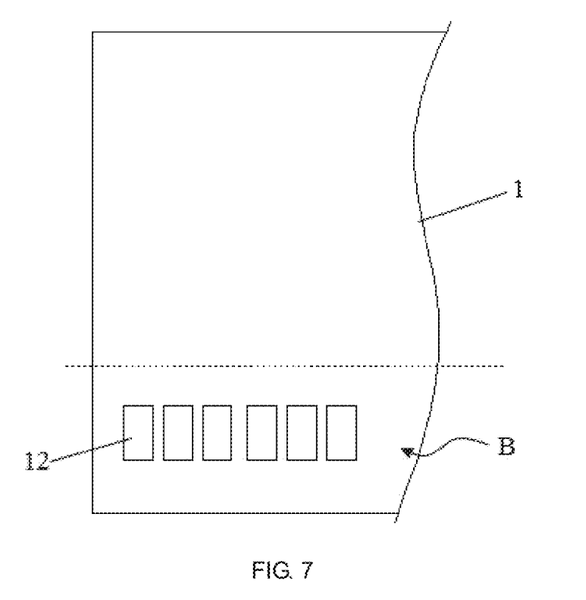
FIG. 7 and FIG. 9 are structural schematic view of a first electrode on the TFT array substrate according to some embodiments of the disclosure.

Specifically, please refer to FIG. 6 and FIG. 7. In the non-display region B, a plurality of projections 23 and a plurality of the second electrodes 24 insulated each other which are formed on the color filter substrate 2. Each of the square electrodes 21a is corresponding to a projection 23 and a second electrode 24. A plurality of second electrodes 24 are corresponding to a plurality of the first electrodes 12 which insulated to each other, that are positioned on the TFT array substrate 1. The touch wire 22 which corresponding by each of the square electrodes 21a is connected to the second electrode 24 according to the second hole 25b. Then, the first electrode 12 which corresponding to the second electrode 24 is connected to the chip bonding portion 11. So that, the connecting wires which connected between each the square electrodes and the chip bonding portions are independent.

Figure 8:
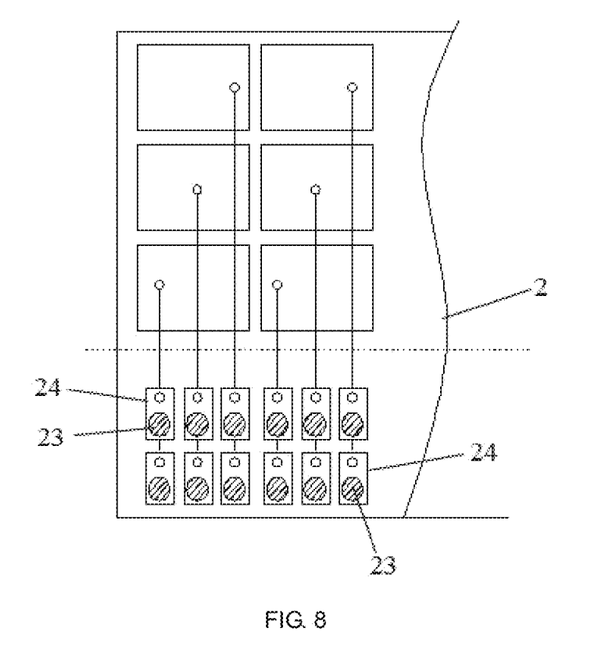
Figure 9:
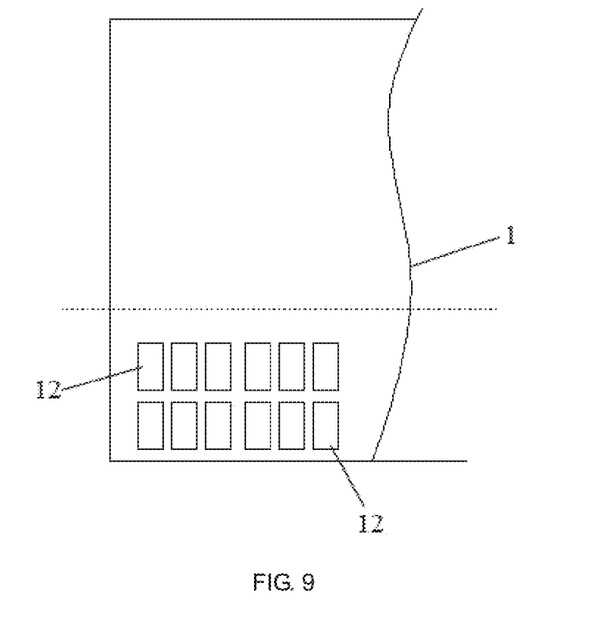

In another embodiment, please refer to FIG. 8 and FIG. 9. The projections 23 and the second electrodes 24 are formed to two columns and arranged side by side on the color filter substrate 2. The first electrodes 12 also are formed to two columns and arranged side by side on the TFT array substrate 1. The touch wires 22 which corresponding to each of the square electrodes 21a are connected with the second electrodes 24 which formed to two columns and arranged side by side. Then, the first electrode 12 which corresponding to the second electrode 24 which formed to two columns and arranged side by side is connected to the chip bonding portion 11. It provides better property of electrical connection of the connecting wire between the square electrode 21a and the chip bounding portion 11 according to add the conductive portion.

In sum, the in-cell touch panel of the embodiment in this invention which is positioned the in-cell touch structure on the color filter substrate, and the connecting wire which positioned in the non-display region is connected to the array substrate. Comparing with the array substrate, the color filter substrate has simple structure so that interference between in-cell touch structure and other structure is probably decreased. It enhances stable of the touch signal of in-cell touch panel, and decreases difficulty of manufacture.

Figure 10:
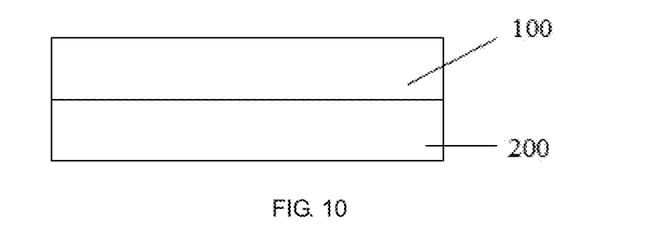
FIG. 10 is a structural schematic view of a display device according to an embodiment of the disclosure.

In this embodiment further provides a display device, please refer to FIG. 10. The display device comprises a liquid crystal display panel 100 and a backlight system 200. The liquid crystal display panel 100 is correspondingly positioned to the backlight system 200. The backlight system 200 provides light source to the liquid crystal display panel 100 for displaying image. Wherein the liquid crystal display panel 100 is an in-cell touch panel described.

It should be explained that the relationship terms, such as first and second, etc., in the present application are only used for distinguishing one entity or operation from another entity or operation without requiring or implying any actual relation or sequence existing between these entities or operations. Moreover, the term "include", "contain" or any other variant means covering instead of exclusively including, so that the process, method, object or device including a series of factors not only includes those factors, but also includes other factors that are not explicitly listed, or further include inherent factors for this process, method, object or device. In a case of no more limitations being provided, the factors defined by the expression "include one . . . " do not exclude additional identical factors existing in the process, method, object or device which includes the factors.

The above statements are only the specific embodiments of the present application. It should be pointed out that improvements and modification can be made by those ordinary skilled in the art without breaking away from the principle of the present application, also those improvements and modification should be considered as the protection scope of the present application.

What is claimed is:

1. An in-cell touch panel, comprising a TFT array substrate and a color filter substrate corresponding to the TFT array substrate, and the in-cell touch panel is divided to a display region and a non-display region, wherein
   in the non-display region, a chip bonding portion and a first electrode are positioned on the TFT array substrate, and the first electrode is electrically connected with the chip bonding portion; a second electrode and a projection are formed on the color filter substrate, the second electrode is covered on the projection; wherein an end of the projection is contacted to the first electrode for electrically conducting the first electrode and the second electrode;
   in the display region, a touch electrode and a touch wire are positioned on the color filter substrate, a first terminal of the touch wire is electrically connected with the touch electrode, a second terminal of the touch wire is extended to the non-display region and electrically connected with the second electrode;
   wherein the touch electrode and the touch wire are positioned on different layers, the touch electrode is electrically connected with the first terminal of the touch wire by a first hole and the second electrode is electrically connected with the second terminal of the touch wire by a second hole; and
   wherein the color filter substrate comprises a glass substrate and, a black matrix and a color photoresist layer sequentially are formed on the glass substrate, the projection is formed on the color photoresist layer; position of the touch wire and the touch electrode as structure (I) or structure (II); wherein
   structure (I), the touch wire is positioned between the color photoresist layer and the black matrix, and the touch electrode is positioned on a side of the color photoresist layer which is positioned away the black matrix;
   structure (II), the touch wire is positioned between the black matrix and the glass substrate, and the touch electrode is positioned on a side of the color photoresist layer which is positioned away the black matrix.

2. The in-cell touch panel according to claim 1, wherein a first planar layer is positioned on the color photoresist layer, the projection is formed on the first planar layer; position of the touch wire and the touch electrode is selected from one of structure (I), structure (II), structure (III) and structure (IV); wherein
   structure (III), the touch wire is positioned between the color photoresist layer and the first planar layer, and the touch electrode is positioned on a side of the first planar layer which is positioned away the color photoresist layer;
   structure (IV), a second planar layer is positioned between the color photoresist layer and the first planar layer, the touch wire is positioned between the second planar layer and the first planar layer, and touch electrode is positioned on a side of the first planar layer which is positioned away the second planar layer.

3. The in-cell touch panel according to claim 1, wherein the touch electrode includes a plurality of square electrodes arranged in array, and the touch wire coupled between each of the square electrodes and the chip bonding portion is independently.

4. The in-cell touch panel according to claim 3, wherein the color filter substrate further comprises a common electrode; wherein the touch electrode is to be the common electrode, the touch electrode separately applying a touch signal and a common voltage signal by time.

5. The in-cell touch panel according to claim 1, wherein the first electrode is electrically connected with the chip bonding portion by a connecting wire positioned on the TFT array substrate, and area of the first electrode is greater than area of end of the projection.

6. The in-cell touch panel according to claim 5, wherein a pixel electrode layer is positioned on the TFT array substrate, the first electrode and the connecting wire are respectively positioned in the pixel electrode layer.

7. The in-cell touch panel according to claim 5, wherein a signal-line layer, a insulating layer and the pixel electrode layer are sequentially positioned on the TFT array substrate, the first electrode is positioned in the pixel electrode layer, the connecting wire is positioned in the signal-line layer, and the first electrode is electrically connected with the connecting wire by a hole located in the insulating layer.

8. A display device comprises a liquid crystal display panel and a backlight system, the liquid crystal display panel is correspondingly positioned to the backlight system, the backlight system provides light source to the liquid crystal display panel for displaying image, characterized by the liquid crystal display panel is an in-cell touch panel, the in-cell touch panel comprising a TFT array substrate and a color filter substrate corresponding to the TFT array substrate, and the in-cell touch panel is divided to a display region and a non-display region, wherein,
   in the non-display region, a chip bonding portion and a first electrode are positioned on the TFT array substrate, and the first electrode is electrically connected with the chip bonding portion; a second electrode and a projection are formed on the color filter substrate, the second electrode is covered on the projection; wherein an end of the projection is contacted to the first electrode for electrically conducting the first electrode and the second electrode;
   in the display region, a touch electrode and a touch wire are positioned on the color filter substrate, a first terminal of the touch wire is electrically connected with the touch electrode, a second terminal of the touch wire is extended to the non-display region and electrically connected with the second electrode;
   wherein the touch electrode and the touch wire are positioned on different layers, the touch electrode is electrically connected with the first terminal of the touch wire by a first hole and the second electrode is electrically connected with the second terminal of the touch wire by a second hole; and
   wherein the color filter substrate comprises a glass substrate and, a black matrix and a color photoresist layer sequentially are formed on the glass substrate, the projection is formed on the color photoresist layer; position of the touch wire and the touch electrode as structure (I) or structure (II); wherein
   structure (I), the touch wire is positioned between the color photoresist layer and the black matrix, and the touch electrode is positioned on a side of the color photoresist layer which is positioned away the black matrix;

structure (II), the touch wire is positioned between the black matrix and the glass substrate, and the touch electrode is positioned on a side of the color photoresist layer which is positioned away the black matrix.

9. The display device according to claim 8, wherein a first planar layer is positioned on the color photoresist layer, the projection is formed on the first planar layer; position of the touch wire and the touch electrode is selected from one of structure (I), structure (II), structure (III) and structure (IV); wherein structure (III), the touch wire is positioned between the color photoresist layer and the first planar layer, and the touch electrode is positioned on a side of the first planar layer which is positioned away the color photoresist layer;

structure (IV), a second planar layer is positioned between the color photoresist layer and the first planar layer, the touch wire is positioned between the second planar layer and the first planar layer, and touch electrode is positioned on a side of the first planar layer which is positioned away the second planar layer.

10. The display device according to claim 8, wherein the touch electrode includes a plurality of square electrodes arranged in array, and the touch wire coupled between each of the square electrodes and the chip bonding portion is independently.

11. The in-cell touch panel according to claim 10, wherein the color filter substrate further comprises a common electrode; wherein the touch electrode is to be the common electrode, the touch electrode separately applying a touch signal and a common voltage signal by time.

12. The display device according to claim 8, wherein the first electrode is electrically connected with the chip bonding portion by a connecting wire positioned on the TFT array substrate, and area of the first electrode is greater than area of end of the projection.

13. The display device according to claim 12, wherein a pixel electrode layer is positioned on the TFT array substrate, the first electrode and the connecting wire are respectively positioned in the pixel electrode layer.

14. The display device according to claim 12, wherein a signal-line layer, an insulating layer and the pixel electrode layer are sequentially positioned on the TFT array substrate, the first electrode is positioned in the pixel electrode layer, the connecting wire is positioned in the signal-line layer, and the first electrode is electrically connected with the connecting wire by a hole located in the insulating layer.

* * * * *